United States Patent [19]

Bardai et al.

[11] Patent Number: 4,943,343

[45] Date of Patent: Jul. 24, 1990

[54] SELF-ALIGNED GATE PROCESS FOR FABRICATING FIELD EMITTER ARRAYS

[76] Inventors: Zaher Bardai, 5229 Doris Way, Torrance, Calif. 90505; Randy K. Rolph, 1011 Avenue C, Redondo Beach, Calif. 90277; Arlene E. Lamb, 2010 Curtis Ave., Redondo Beach, Calif. 90278; Robert T. Longo, 734 Callita St., Arcadia, Calif. 91006; Arthur E. Manoly, 26630 Basswood Ave., Rancho Palos Verdes, Calif. 90274; Ralph Forman, 21516 Hilliard Blvd., Rocky River, Ohio 44116

[21] Appl. No.: 393,199

[22] Filed: Aug. 14, 1989

[51] Int. Cl.[5] ...................... H01L 21/306; B44C 1/22; C03C 15/00; C23F 1/02

[52] U.S. Cl. .................................... 156/643; 156/644; 156/646; 156/653; 156/656; 156/657; 156/659.1; 313/309; 313/351; 357/55; 437/4; 437/41

[58] Field of Search ............... 156/643, 644, 646, 653, 156/656, 657, 659.1, 661.1; 313/309, 351; 357/55; 437/4, 41

[56] References Cited

U.S. PATENT DOCUMENTS

| | | | |
|---|---|---|---|
| 3,453,478 | 7/1969 | Shoulders et al. | 313/309 |
| 3,665,241 | 5/1972 | Spindt et al. | 313/351 |
| 3,755,704 | 8/1973 | Spindt et al. | 313/309 |
| 3,921,022 | 11/1975 | Levine | 313/309 |
| 3,998,678 | 12/1976 | Fukase et al. | 156/3 |
| 4,008,412 | 2/1977 | Yuito et al. | 313/309 |
| 4,307,507 | 12/1981 | Gray et al. | 29/580 |
| 4,513,308 | 4/1985 | Greene et al. | 357/55 |

OTHER PUBLICATIONS

Gray et al., "A Vacuum Field Effect Transistor Using Silicon Field Emitter Arrays", IEDM, 1986, pp. 776–779.

C. A. Spindt, "A Thin-Film Field-Emission Cathode", Journal of Applied Physics, vol. 39, No. 7, Jun. 1986, pp. 3504–3505.

C. A. Spindt et al., "Physical Properties of Thin-Film Field Emission Cathodes with Molybdenum Cones", Journal of Applied Physics, vol. 47, No. 12, Dec. 1976, pp. 5248–5263.

C. A. Spindt et al., "Recent Progress in Low-Voltage Field-Emission Cathode Development", Journal de Physique, vol. 45, No. C-9, Dec. 1984, pp. 269–278.

*Primary Examiner*—William A. Powell

*Attorney, Agent, or Firm*—Terje Gudmestad; Paul M. Coble; Wanda K. Denson-Low

[57] ABSTRACT

Conical field emitter elements are formed on a surface of a substrate after which a layer of metal is deposited on top of the substrate surface and over the field emitter elements. A layer of oxide is then deposited over the metal layer. Another layer of metal is deposited over the layer of oxide to form a gate metal layer. A layer of photoresist is then deposited over the gate metal layer. The layer of photoresist is then plasma etched in an oxygen atmosphere to cause portions of the photoresist above respective field emitter elements to be removed and provide self-aligned holes in the photoresist over each of the field emitter elements. The size of the holes may be controlled by appropriately controlling process parameter, including plasma etching time and power and/or initial photoresist thickness. The exposed gate metal layer is etched using the layer of photoresist as a mask. The photoresist layer is removed, and the layer of oxide is etched to expose the field emitter elements. Another oxide layer and an anode metal layer also may be formed over the gate metal layer to produce a self-aligned triode structure.

13 Claims, 2 Drawing Sheets

SELF-ALIGNED GATE PROCESS FOR FABRICATING FIELD EMITTER ARRAYS

BACKGROUND

The present invention relates generally to field emitter arrays, and more particularly to a process for fabricating self-aligned micron-sized field emitter arrays.

Recently there has been considerable interest in field emitter arrays for reasons discussed by H. F. Gray et al. in "A Vacuum Field Effect Transistor Using Silicon Field Emitter Arrays", IEDM, 1986, pages 776–779. Field emitter arrays typically comprise a metal/insulator/metal film sandwich with a cellular array of holes through the upper metal and insulator layers, leaving the edges of the upper metal layer (which serves as an accelerator electrode) effectively exposed to the upper surface of the lower metal layer (which serves as an emitter electrode). A number of conically-shaped electron emitter elements are mounted on the lower metal layer and extend upwardly therefrom such that their respective tips are located in respective holes in the upper metal layer. If appropriate voltages are applied between the emitter electrode, accelerator electrode, and an anode located above the accelerator electrode, electrons are caused to flow from the respective cone tips to the anode. Further details regarding these devices may be found in the papers by C. A. Spindt, "A Thin-Film Field-Emission Cathode", *Journal of Applied Physics,* Vol. 39, No. 7, June 1986, pages 3504–3505, C. A. Spindt et al., "Physical Properties of Thin-Film Field Emission Cathodes with Molybdenum Cones", *Journal of Applied Physics,* Vol. 47, No. 12, December 1976, pages 5248–5263, and C. A. Spindt et al., "Recent Progress in Low-Voltage Field-Emission Cathode Development", *Journal de Physique,* Vol. 45, No. C-9, December 1984, pages 269–278, and in U.S. Pat. No. 3,453,478 to K. R. Shoulders et al. and U.S. Pat. Nos. 3,665,241 and 3,755,704 to C. A. Spindt et al. Additional patents disclosing methods for fabricating field emitter array devices are U.S. Pat. No. 3,921,022 to J. D. Levine, U.S. Pat. No. 3,998,678 to S. Fukase et al., U.S. Pat. No. 4,008,412 to I. Yuito et al., U.S. Pat. No. 4,307,507 to H. F. Gray et al., and U.S. Pat. No. 4,513,308 to R. F. Greene et al.

In the conventional approaches to fabrication of field emitter arrays, precise alignment and hole size control has been very difficult to achieve, because of the very small geometries and tolerances in the devices. Typically, in order to obtain precise alignment, it has been necessary to employ a difficult and time-consuming mask step to insure proper alignment and formation.

Accordingly, it would be advantageous to have a process of fabricating field emitter arrays that was self-aligning and that is less difficult and costly to implement.

SUMMARY OF THE INVENTION

In order to provide for an improved process by which to form field emitter arrays, the present invention fabricates the arrays in accordance with the following process steps. Substantially conical field emitter elements are formed on a surface of a substrate, after which a layer of oxide is deposited on the substrate surface and over the field emitter elements. A layer of metal is then deposited over the layer of oxide to form a gate metal layer. A layer of photoresist is then deposited over the gate metal layer.

The layer of photoresist is then plasma etched in an oxygen atmosphere to cause portions of the photoresist above respective field emitter elements to be removed and thereby provide self-aligned holes in the photoresist over each of the field emitter elements. The exposed gate metal layer above the field emitter elements is then etched using the layer of photoresist as a mask. The photoresist layer is removed, and the layer of oxide is etched to expose the field emitter elements.

In addition, further processing may be performed to provide a second oxide layer and an anode metal layer in field emission triode devices.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
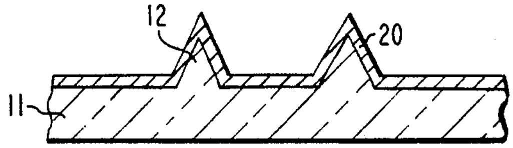
FIGS. 1 through 8 illustrate a preferred process of fabricating a field emitter array in accordance with the principles of the present invention.
Figure 2:
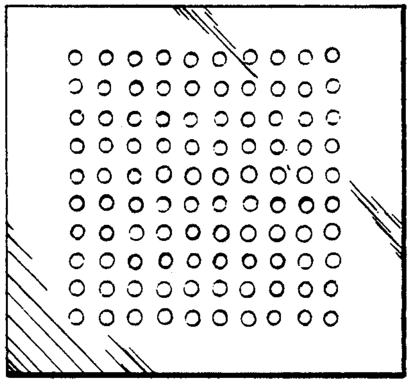

Referring to the drawings, FIGS. 1 and 2 show side and top views, respectively, of a substrate 11 having field emitter elements 12 formed on a surface of the substrate. The substrate 11 and the field emitter elements 12 may be of polysilicon, for example. The substrate 11 is fabricated in a conventional manner to provide an array of emitter elements thereon, with FIG. 2 showing a typical field emitter array. Typically, the substrate 11 and the field emitter elements 12 have a metal layer 20 disposed thereover. This metal layer 20 may be of molybdenum, for example. The metal layer 20 is typically deposited over elements 12 and substrate 11 to a thickness of from about 250Å to about 2000Å, for example. It should be understood, however, that the metal layer 20 may be eliminated in some applications.

Figure 3:
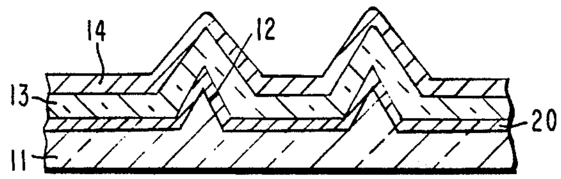

Referring to FIG. 3, a layer of oxide 13 is deposited over the surface of the substrate 11 and the field emitter elements 12 (or the metal layer 20 if it is employed). The oxide layer 13 is typically formed using a chemical vapor deposition process. The oxide layer 13 is deposited to a thickness of from about 5000Å to about 15000Å, for example. A gate metal layer 14, comprising a layer of chromium and a layer of gold, for example, is then deposited over the layer of oxide 13. The chromium layer may have a thickness of from about 300Å to about 1000Å, while the gold layer may have a thickness of from about 2000Å to about 5000Å, for example.

Figure 4:
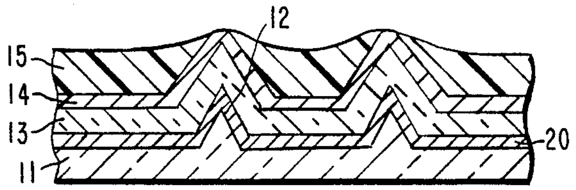

With reference to FIG. 4, a layer of photoresist 15 is then deposited over the gate metal layer 14. The layer of photoresist 15 is typically deposited using a conventional spin-on procedure employing Hoechst AZ 1370 photoresist spun on at 4000 RPM for about 20 seconds, for example.

Figure 5:
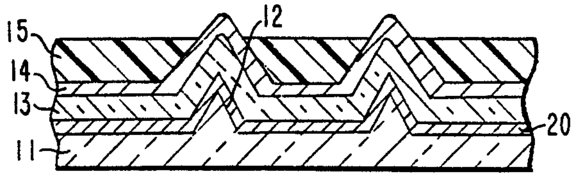

The structure of FIG. 4 is then processed to cause portions of the layer of photoresist 15 above respective field emitter elements 12 to be removed, as shown in FIG. 5, and thereby expose respective portions of the gate metal layer 14 above respective tip regions of the field emitter elements 12. This may be accomplished by plasma etching the layer of photoresist 15 in an oxygen environment. The plasma etching operation may be carried out in a plasma discharge stripping and etching system Model No. PDS/PDE-301 manufactured by LFE Corporation, Waltham, Mass., for example. As a specific example for illustrative purposes, in performing such a plasma etching process on a field emitter array structure having the aforementioned specific parameters, the aforementioned plasma discharge system may be initially evacuated to a pressure of about 0.1 torr, after which a regulated flow of oxygen gas may be passed through the system at a flow rate of about 240 cc per minute and at a pressure of about 3 torr before commencement of the plasma discharge. A plasma discharge is then established in the system for a predetermined time to achieve the desired photoresist removal. As a specific example for illustrative purposes, when a single 2-inch wafer having a field emitter array structure formed thereon with the aforementioned parameter values is processed in the aforementioned system at a plasma discharge power setting of about 250 watts, a plasma etching duration of about 2 minutes has achieved the desired photoresist removal.

As a result of the plasma etching step, precisely-aligned openings 16 are formed directly over respective field emitter elements 12 of the array. The size of the openings 16 may be controlled by appropriately controlling process parameters, including time and power setting of the plasma discharge apparatus and/or the initial thickness of the layer of photoresist 15.

Figure 6:
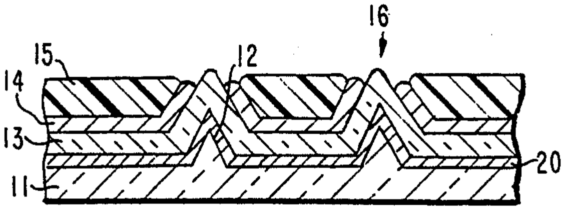

With reference to FIG. 6, the field emitter elements 12 that have been exposed via openings 16 in the preceding step are then etched by means of a conventional etching procedure, for example, using the layer of photoresist 15 as a mask. For example, a mixture of water and potassium iodide may be employed for a time duration of from about 1 minute to about 5 minutes to etch the gold, for example, and potassium permanganate for about 7 seconds, and oxalic for about 7 seconds may be employed to etch the chromium, for example.

Figure 7:
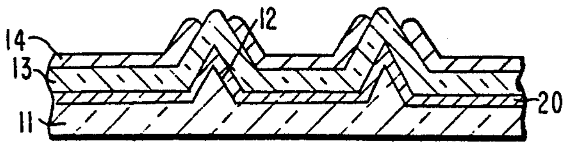
Figure 8:
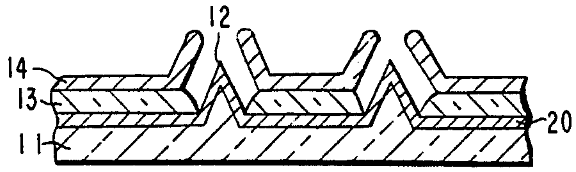

Referring to FIGS. 7 and 8, the layer of photoresist 15 is then removed, and the layer of oxide 13 is etched using a conventional etching procedure using buffered hydrogen fluoride, for example, to expose the field emitter elements 12. This results in a self-aligned cathode structure as shown in FIG. 8.

Figure 9:
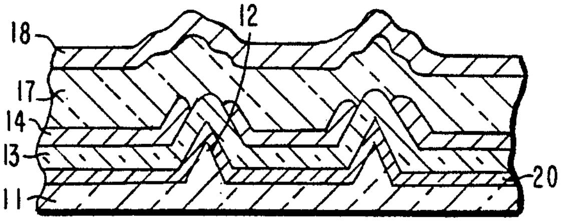
FIGS. 9 and 10 illustrate additional processing steps employed in fabricating a field emission triode.
Figure 10:
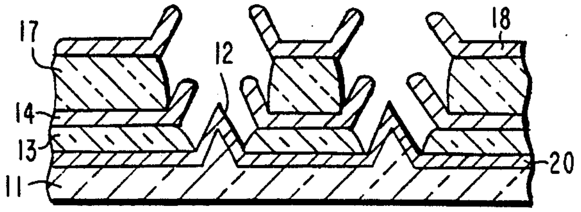

With reference to FIGS. 9 and 10, additional processing steps are illustrated that enable fabrication of a self-aligned anode structure above the field emission cathode structure fabricated pursuant to the process of FIGS. 1–8. To fabricate the anode structure after the photoresist layer 15 is removed as shown in FIG. 7, a second layer of oxide 17 is deposited on top of the gate metal layer 14, after which an additional layer of metal 18, which may serve as an anode metal layer in the resultant device, is deposited over the second layer of oxide 17.

Next, the structure of FIG. 9 is processed in a manner described above with respect to FIGS. 4–8. In particular, a layer of photoresist is applied to the top surface of the anode metal layer 18 and is then plasma etched to remove portions of the layer of photoresist above the elements 12. The anode metal layer 18 is then etched using the layer of photoresist as a mask. The layer of photoresist is then removed, and the first and second oxide layers 13,17 are etched to expose the field emitter elements 12, resulting in the structure shown in FIG. 10.

It is to be understood that the above-described embodiments are merely illustrative of some of the many specific embodiments utilizing the principles of the present invention. Clearly, numerous and other arrangements can be readily devised by those skilled in the art without departing from the scope of the invention. For example, metal may be used instead of polysilicon to form the substrate and the emitter elements. Also, dry etching of the oxide and metal layers may be employed where anisotropic etching is critical. In addition, the gate metal layer may be comprised of metal alloys other than chromium and gold, such as by molybdenum, for example.

What is claimed is:

1. A process for fabricating a field emitter array, said process comprising the steps of;

forming substantially conical field emitter elements on a surface of a substrate;

depositing a layer of oxide over said substrate surface and said field emitter elements;

depositing a layer of metal over said layer of oxide to form a gate metal layer;

depositing a layer of photoresist over said gate metal layer;

plasma etching said layer of photoresist in an oxygen atmosphere to cause portions of photoresist above respective field emitter elements to be removed and thereby expose respective portions of said gate metal layer above respective tip regions of said field emitter elements;

etching the exposed portions of said gate metal layer using said layer of photoresist as a mask;

removing said layer of photoresist; and etching the exposed portions of said layer of oxide to expose said field emitter elements.

2. A process according to claim 1 wherein said substrate and said field emitter elements are of polysilicon.

3. A process according to claim 1 wherein the step of depositing a layer of metal over said layer of oxide comprises the steps of:

depositing a layer of chromium on said layer of oxide; and depositing a layer of gold on said layer of chromium.

4. A process according to claim 1 wherein the step of plasma etching said layer of photoresist comprises the steps of:

placing said substrate in plasma discharge apparatus;

evacuating the apparatus to a predetermined pressure;

passing a regulated flow of oxygen gas over said substrate; and establishing a plasma discharge in said apparatus for a predetermined time.

5. A process for fabricating a field emitter array, said process comprising the steps of;

forming substantially conical field emitter elements on a surface of a substrate;

depositing a first layer of metal on said substrate surface and over said field emitter elements;

depositing a layer of oxide over said first layer of metal;

depositing a second layer of metal over said layer of oxide to form a gate metal layer:

depositing a layer of photoresist over said gate metal layer;

plasma etching said layer of photoresist in an oxygen atmosphere to cause portions of photoresist above respective field emitter elements to be removed and thereby expose respective portions of said gate metal layer above respective tip regions of said field emitter elements;

etching the exposed portions of said gate metal layer using the layer of photoresist as a mask;

removing said layer of photoresist; and etching the exposed portions of said layer of oxide to expose said field emitter elements.

6. A process according to claim 5 wherein said substrate and said field emitter elements are of polysilicon.

7. A process according to claim 5 wherein said first layer of metal is of molybdenum.

8. A process according to claim 5 wherein the step of depositing a second layer of metal over said layer of oxide comprises the steps of:

depositing a layer of chromium on said layer of oxide; and depositing a layer of gold on said layer of chromium.

9. A process according to claim 5 wherein the step of plasma etching said layer of photoresist comprises the steps of:

placing said substrate in plasma discharge apparatus;

evacuating the apparatus to a predetermined pressure;

passing a regulated flow of oxygen gas over said substrate; and establishing a plasma discharge in said apparatus for a predetermined time.

10. A process for fabricating a field emitter triode array, said process comprising the steps of:

forming substantially conical field emitter elements on a surface of a substrate;

depositing a first layer of oxide over said substrate surface and said field emitter elements;

depositing a layer of metal over said layer of oxide to form a gate metal layer;

depositing a first layer of photoresist over said gate metal layer;

plasma etching said first layer of photoresist in an oxygen atmosphere to cause portions of photoresist above respective field emitter elements to be removed and thereby expose respective portions of said gate metal layer above respective tip regions of said field emitter elements;

etching the exposed portions of said gate metal layer using said first layer of photoresist as a mask;

removing said first layer of photoresist;

depositing a second layer of oxide over said gate metal layer and over respective portions of said first oxide layer not covered by said gate metal layer;

depositing a layer of metal over said second layer of oxide to form an anode metal layer;

depositing a second layer of photoresist over said anode metal layer;

plasma etching said second layer of photoresist in an oxygen atmosphere to cause portions of photoresist in said second layer above respective field emitter elements to be removed and thereby expose respective portions of said anode metal layer above respective tip regions of said field emitter elements;

etching the exposed portions of said anode metal layer using said second layer of photoresist as a mask; and etching the exposed portions of said first and second layers of oxide to expose said field emitter elements

11. A process according to claim 10 wherein said substrate and said field emitter elements are of polysilicon.

12. A process according to claim 11 wherein the step of depositing a layer of metal over said layer of oxide to form a gate metal layer comprises the steps of:

depositing a layer of chromium on said layer of oxide; and depositing a layer of gold on said layer of chromium.

13. A process according to claim 10 wherein the steps of plasma etching said first and said second layers of photoresist each comprises the steps of:

placing said substrate in plasma discharge apparatus;

evacuating the apparatus to a predetermined pressure;

passing a regulated flow of oxygen gas over said substrate; and establishing a plasma discharge in said apparatus for a predetermined time.

* * * * *